US006754135B2

(12) United States Patent
Pilo

(10) Patent No.: US 6,754,135 B2
(45) Date of Patent: Jun. 22, 2004

(54) REDUCED LATENCY WIDE-I/O BURST ARCHITECTURE

(75) Inventor: Harold Pilo, Underhill, VT (US)

(73) Assignee: International Business Machines Corporation, Armonk, NY (US)

(*) Notice: Subject to any disclaimer, the term of this patent is extended or adjusted under 35 U.S.C. 154(b) by 78 days.

(21) Appl. No.: 10/065,056

(22) Filed: Sep. 13, 2002

(65) Prior Publication Data

US 2004/0054824 A1 Mar. 18, 2004

(51) Int. Cl.[7] ................................................ G11C 7/00

(52) U.S. Cl. ...................................... 365/238; 365/236

(58) Field of Search ................................. 365/238, 236, 365/233, 189.02, 189.05; 710/135

(56) References Cited

U.S. PATENT DOCUMENTS

| 5,532,970 A | | 7/1996 | Butler et al. ............ 365/230.05 |
| 6,115,280 A | * | 9/2000 | Wada ........................... 365/78 |
| 6,622,197 B1 | * | 9/2003 | Kim ............................ 711/100 |

OTHER PUBLICATIONS

Klee et al., "A 0.13 m Logic–Based Embedded DRAM Technology with Electrical Fuses, Cu Interconnects in Silk (tm), Sub 7 ns Random Access Time and its Extension to the 0.10 m Generation," Proceedings of IEDM, pp. 407–410, Dec. 2001. Pilo et al., "An 833MHz 1.5W 18 Mb CMOS SRAM with 1.67Gb/s/pin," ISSCC Digest of Technical Papers, pp. 266–267, Feb. 2000. Agata et al., "An 8ns Random Cycle Embedded RAM Macro with Dual–Port Interleaved DRAM Architecture (D2RAM)," ISSCC Digest of Technical Papers, pp. 392–393, Feb. 2000.

* cited by examiner

Primary Examiner—Tan T. Nguyen
(74) Attorney, Agent, or Firm—Robert A. Walsh

(57) ABSTRACT

A method for bursting data in a wide I/O memory device with improved access time and reduced data-bus complexity. The memory read operation accesses n bits of data which are output in eight n/8-bit I/O words in any particular order in accordance with the burst base address and linear or interleaved burst sequence controls. For every I/O, eight bits of data are presented to a 9-to-1 multiplexer. The first of eight bits in the burst sequence is the access time-limiting bit and is preselected by the burst base addresses of the 9-to-1 multiplexer. Subsequent bits in the burst sequence have extra half-cycles to be output, and use look-aside 8-to-1 multiplexers controlled by a burst counter with timings synchronized to the burst data clock timings.

14 Claims, 5 Drawing Sheets

REDUCED LATENCY WIDE-I/O BURST ARCHITECTURE

BACKGROUND OF THE INVENTION

1. Field of the Invention

This invention relates in general to high speed computer systems where memory chips are used as L2 or L3 cache memory for the microprocessor. More particularly, the invention relates to memory chips where data is transferred from the memory to the processor and from the processor to the memory in data bursts of four or more words where the burst of data can be of any particular addressing order. This invention improves the latency of the burst of data by the memory system and simplifies the on-chip circuit implementation.

2. Background of the Invention

Most workstation and server computer systems require a memory hierarchy to process and store data in the most efficient manner. Typically, the furthest away the memory resides from the processor, the slower it is, but also the densest it becomes. Likewise, the closest memory is to the processor, the greater the performance. Most memory hierarchies have three or four memory levels, also known as L1, L2, L3 and L4. The L1 and L2 memory is typically embedded in the processor, thus their capacity is normally limited to 16 Mb or less. The L1 and L2 memory is typically in the form of Static Random Access Memory (SRAM), since its performance requirements have to keep up with processor cycle times. Once the memory level moves off-chip, its performance can no longer keep up with the processor cycle times because of I/O bandwidth limitations. Typically, L3 memories are operated at a fraction of the processor cycle time. Nonetheless, L3 performance as measured by core cycle time and latency may still be the bottleneck for the entire cache subsystem. As a result, L3 cache have typically used SRAM because of its superior performance over commodity Dynamic Random Access Memory (DRAM), despite the density disadvantages of SRAM. When gauging memory performance, three factors come into play: I/O bandwidth (also known as data rate), random cycle time and latency. Data rate refers as the time that it takes to transfer data words from the memory to the processor (and vice-versa). Random cycle refers to the period between random addresses as captured by the memory, and finally, latency refers to the time that it takes for the memory to start producing data from the time that a random address is captured.

Emerging process technologies are enabling DRAM cells to be embedded into logic-based processes. Logic-based DRAM performance can be as much as 4× faster than DRAMs fabricated using commodity-DRAM processes. Furthermore, new DRAM architectures such as Reduced-Latency DRAM (RLDRAM) or Fast-Cycle DRAM (FCRAM) are offering significant improvements in performance over commodity DRAM. The emergence of faster DRAM is opening the door for applications typically suitable for SRAM only. An example of such memory device is a DRAM built in a logic-based product that offers a 4× the density improvement over SRAM (built in the same lithography). Although the core cycle time of the fast DRAM is still about 4× slower than that of the fastest SRAMs, the data rate and latency of the fast DRAM is fast approaching that of the SRAM's. Such fast DRAM are being used for L3 cache applications with data rates approaching that of fast SRAMs.

The task of making fast DRAM data rates is accomplished by an increase in burst length. For example, a fast SRAM may have a random cycle time of 2 ns and a data burst of two. Data can be output every 1 ns on both rising and falling edges of the clock (Double-Data-Rate (DDR)) to provide a 1 ns data rate. Every 2 ns a random address is presented to the SRAM and data is output in a burst of two within the 2 ns period. A fast DRAM with a 4× slower core cycle-time can achieve the same data rate with an increased burst length of eight. The fast DRAM core cycle time is 4× that of the SRAM in the example above, or 8 ns. Every 8 ns a random address is presented to the fast DRAM. Every 8 ns, data is output in a burst of eight, producing 1 ns data rates.

Such increases in burst length to achieve the same data rates as that of SRAM do not come without architectural complexities. For example, a typical fast SRAM has an I/O configuration of 36 bits (×36). In a burst of two, two sets of 36 bits have to be pre-fetched from the memory array for every core cycle. The two 36 bit words are formatted and prioritized according to the initial burst base address. In order for the DRAM to maintain the same data rate as the SRAM, eight 36 bit words have to be pre-fetched on every DRAM core cycle. The complexity and performance impact arising from prioritizing the eight 36 bit words so that the correct burst order is maintained is much greater than that of the SRAM. The eight 36-bit burst order is not only driven by three burst base addresses, but also by linear or interleaved orders. The user may also choose to change the burst length from eight 36-bit words to four 36-bit words in a single command. The memory design has to be able to process the changes of burst length, burst order and burst base addresses and provide the fastest possible data latency.

SUMMARY OF THE INVENTION

Increasing the data rate of cache memory while providing the fastest possible data latency improves the overall computer system performance. Using DRAM memory over SRAM has a 4× improvement in density, but a similar 4× decrease in DRAM random cycle-time. The DRAM data rate, however, can be made as fast as the SRAM's by increasing the burst length from two to eight. The increase in burst length adds significant on-chip design complexity and latency. This arises from having to prioritize eight 36-bit data words so that the specified burst exit order is maintained. The present invention is directed to a technique that simplifies the bursting operation so that latency is improved and design complexity is minimized.

The present invention comprises a memory system which can be incorporated in a fast DRAM chip. The memory system includes an array of addressable memory cells, decoding circuitry for selecting n memory bits of data, means for latching said n memory bits of data and finally, bursting the n memory bits of data in any specified burst length and burst order in accordance to the captured memory commands and burst base addresses in the specified cycle.

A first embodiment of this invention is a memory array with a wide I/O architecture with multiple subarrays that can be decoded by subarray addresses. The subarrays have an array of wordlines and bitlines. The wordlines of the subarrays are decoded by wordline addresses at the same time a subarray is decoded by subarray addresses. The columns are mapped into eight sections; each column section having a subset of bitlines that are decoded with bitline addresses at the same time a wordline and a subarray is decoded. Each column section has a fixed burst base-address memory allocation. When writing to column sections, data is formatted according to the burst base address prior to being written into the array. In this manner, column sections are updated in the correct fixed addressing order.

A second embodiment of this invention is a method for reading the memory array. During a read operation, a subarray, a wordline within a subarray and one bitline within each column of the decoded subarray are decoded. Data is accessed from each of the eight column sections which have a fixed burst base-address memory allocation. The exit order of the accessed data is specific to the burst base-addresses captured by the memory at the same time subarray, wordline and bitline addresses are captured. The exit order is also specific to a linear or interleaved burst order control pin, and finally, the exit order is also specific to either a burst of four words or a burst of eight words. The embodiment is a method for a burst of data to exit the chip with the minimum latency and simplest on-chip implementation.

These and other features and advantages of this invention will become apparent from the following detailed description of the presently preferred embodiment of the invention, taken in conjunction with the accompanying drawings.

DETAILED DESCRIPTION OF THE INVENTION

Best Mode for Carrying Out the Invention

The present invention is directed to a method to map a set of burst addresses to a subarray of a memory array and a means for exiting the burst bits in any given sequence. The block diagram shown in FIG. 1 describes the burst address mapping into the column space of the subarray. In this example, there is shown 288 columns for receiving or transmitting data. Each column may contain a set of bitlines as represented by Column # 7 (C 7). Since each of the 288 columns have eight bitlines each, there are a total of 2304 bitlines in the subarray. The memory I/O interface consists of 36 I/Os, thus a burst of eight 36-bit words needs 288 columns to write or retrieve data from. This invention, however, is not limited to memories with only 36 I/Os. Each of the eight burst words of 36 bits are mapped into a total of 288 column locations. Table 1 explains the burst base address column allocations. The eight 36-bit words are mapped sequentially starting with address A2–A0=000.

Whenever a read operation occurs, 288 bits are read out of the selected wordline in a subarray. As previously stated, the exit order of each of the eight 36-bit words is dependent upon the A2–A0 addresses, linear or interleave controls and burst of 4 or burst of 8 command. For example, if at the start of a cycle the burst base address is set to 101 and the read command is to perform an interleaved burst of eight, then the burst order becomes: 101, 100, 111, 110, 001, 000, 011, 010. If the same base address is presented, but the command is to perform a linear burst of eight, then the burst order becomes: 101, 110, 111, 000, 001, 010, 011, 100.

Figure 1:
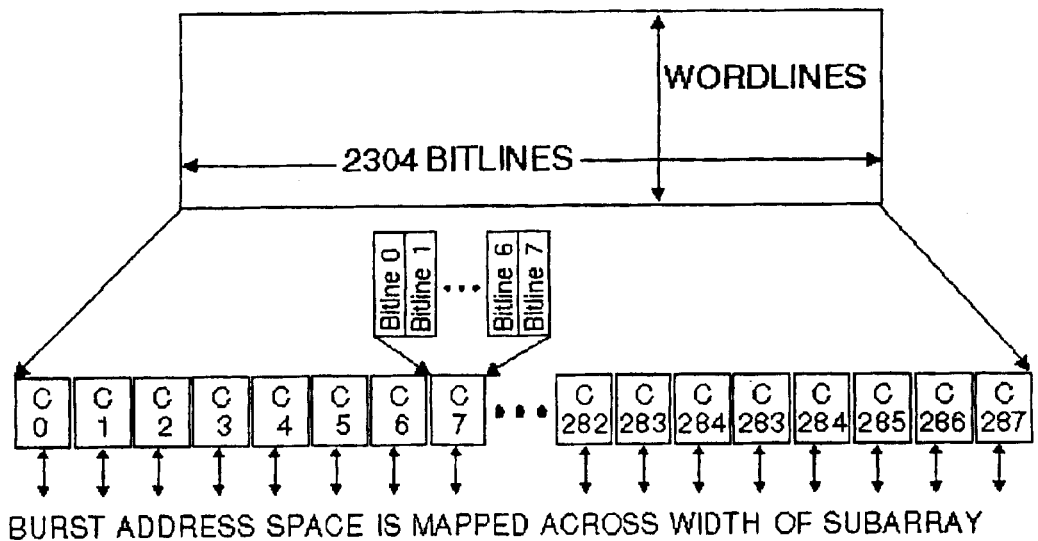
FIG. 1 shows the burst address array mapping in a wide I/O device.
Figure 2:
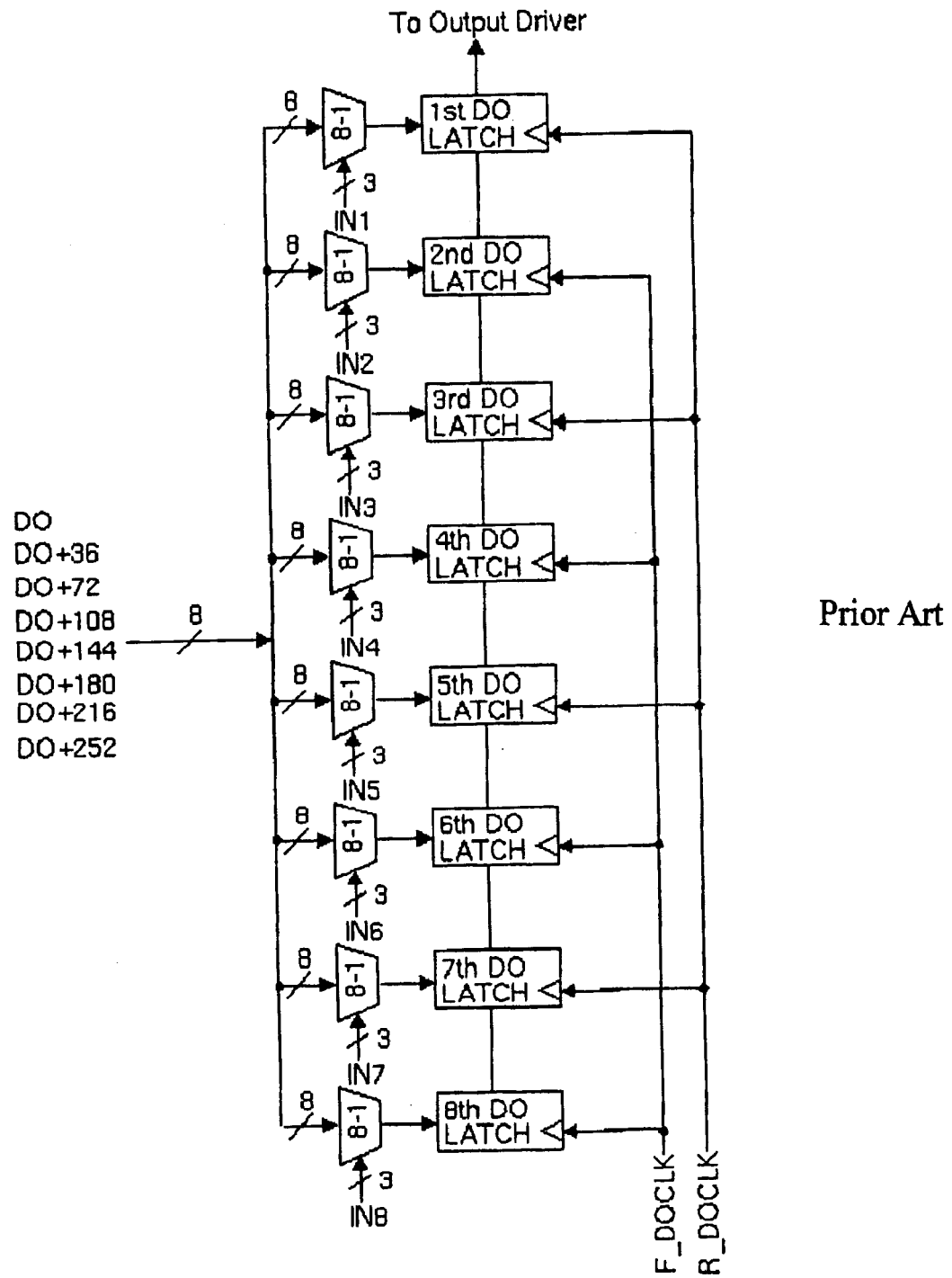
FIG. 2 is a block diagram illustrating the prior art of the burst sequencing circuit.

FIG. 2 illustrates a block diagram of a prior art approach of a burst sequencer for the first of 36 I/Os of the memory that produces a burst of eight bits. The eight input bits to the circuit: DO, DO+36, DO+72, . . . , DO+252 refer to one bit of data from each of the burst address partitions as shown in FIG. 1. The burst sequencer for the second I/O of the memory would receive the following bits: DO+1, DO+73, . . . , DO+253. Each of the eight input bits connects to eight 8-to-1 multiplexers that place the eight data bits in the correct order to be serially shifted out to an output driver. Each of the eight multiplexers has a set of three control inputs that select one of the eight DO data lines. For example if the burst sequence to follow is 101, 110, 111 1,000, 001, 010, 011, 100, the 1st multiplexer connecting to the 1 st data latch (DO LATCH) is controlled with inputs 101 to select DO+180 (data bit associated with burst address 101). The 8th multiplexer connecting to the 8th data latch is controlled with inputs 100 (the last data bit associated with burst address 101). After all eight data latches are loaded with the correct burst sequence, rising-edge clock R_DOCLK and falling-edge clock F_DOCLK sequence the eight bits to an output driver. Although the prior art shown in FIG. 2 provides a workable option for bursting the eight bits of data, it also limits the performance of the device and adds substantial complexity to the memory device. The performance limitation comes from the large data line (DO lines) loading from the eight multiplexers and the large clock loading from the eight data latches.

Figure 3:
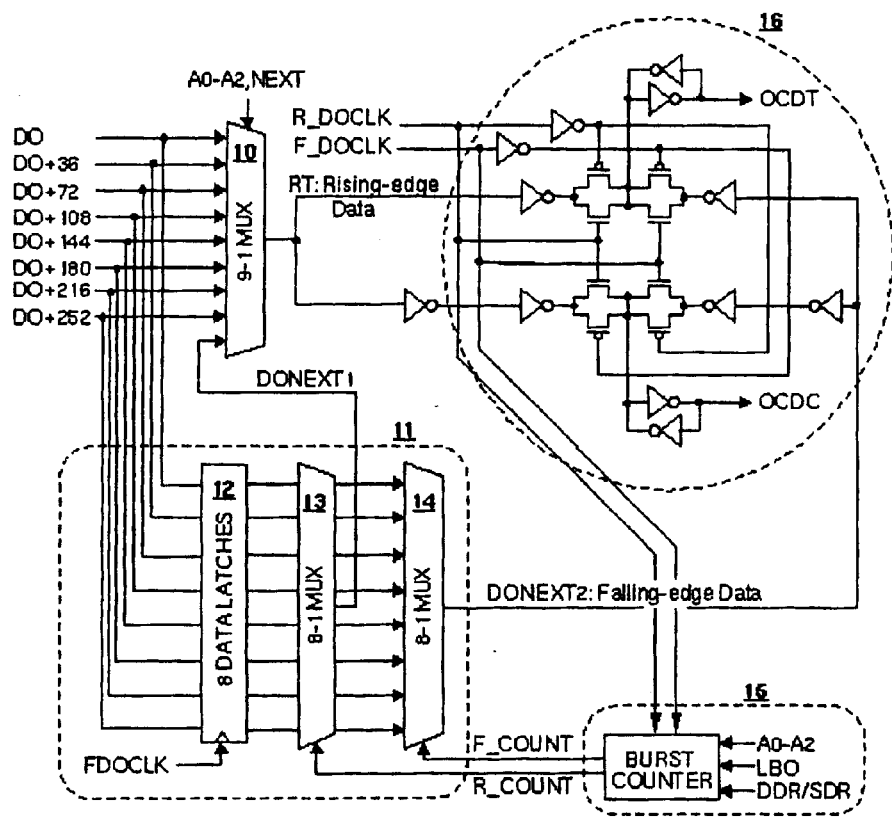
FIG. 3 is a block diagram illustrating the present invention of the burst sequencing circuit.

Attention is now directed to FIG. 3 which illustrates the present invention. The present invention uses a burst sequencer circuit that reduces latency and complexity of implementation as compared to the prior art. The burst sequencer is divided into four main sections: a first-bit 9-to-1 multiplexer 10, subsequent burst bit latches and multiplexers 11, true and complement data-latch pair 1 6 and subsequent burst bit multiplexer controller 15. Data bits DO, DO+36, DO+72, . . . , DO+252 are pre-fetched during a read cycle and presented to the 9-to-1 multiplexer 10. The first of the eight data bits in the burst sequence is the access time-limiting bit and is pre-selected by addresses AO-A2. The first eight inputs of the 9-to-1 multiplexer 10, are used for the first bit only. After the first bit is clocked by rising-edge clock R_DOCLK of the data-latch pair 16, subsequent bits are passed through the 9-to-1 multiplexer 10 using the ninth input (signal DONEXT1) controlled by signal NEXT. The memory system requires that the data from the first bit access appear at the inputs of the data-latch pair 16 before R_DOCLK transitions. This ensures equal data windows for all bits in the burst sequence. Burst sequence latches 12 store eight DO data bits that are used for the remaining seven bits of the burst sequence. DO data bits are latched by strobe FDOCLK at the beginning of a cycle. This ensures that new data from the array does not override the previous cycle's data which is kept throughout the eight-bit burst sequence. The output of the data latches 12, connect to a rising-edge-data 8-to-1 multiplexer 13 and a falling-edge-data 8-to-1 multiplexer 14. The rising-edge-data 8-to-1 multiplexer 13 selects the next bits in the burst sequence to be output on subsequent rising-edge clocks. Its output DONEXT1 is passed through to the data-latch pair 16 using the ninth input of the 9-to-1 multiplexer 10. The falling-edge-data 8-to-1 multiplexer 14 selects the next bits in the burst sequence to be output on subsequent falling-edge clocks. Its output DONEXT is connected to the falling-edge data input of the data-latch pair 16. After the first bit in the burst sequence is output (access time-limiting bit), subsequent bits in the burst sequence have extra half-cycles to be output, and therefore use the slower paths through multiplexers 13 and 14. Both 8-to-1 multiplexers 13 and 14 are controlled by a burst controller 15. The data-latch pair 16 is designed to provide true and complement data to an output driver (OCDT and OCDC, respectively) upon receiving the rising-edge clock R_DOCLK and falling-edge clock F_DOCLK. The data-latch pair 16 is also designed so that the delay of OCDC/OCDT from the R_DOCLK strobe is equal to the delay of OCDC/OCDT from the F_DOCLK strobe. This also ensures equal data windows for all bits in the burst sequence.

Figure 4:
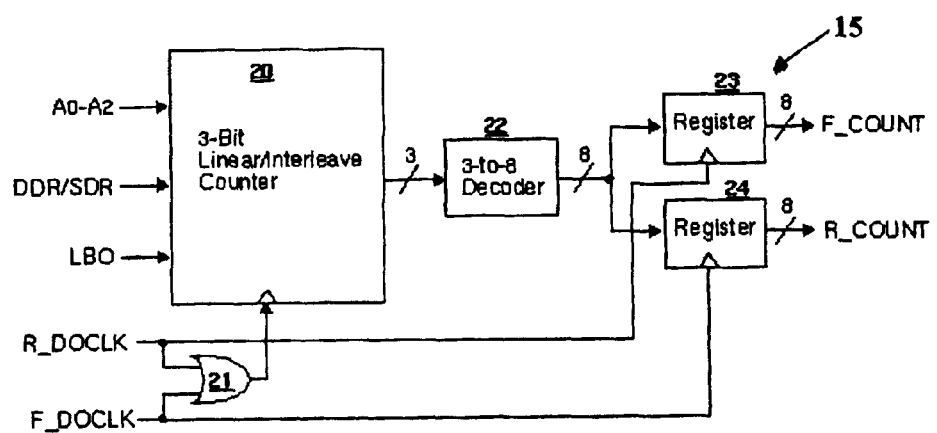
FIG. 4 is a block diagram illustrating the burst address calculator that controls the burst sequencer.

A more detailed schematic of the burst sequence controller 15 is shown in FIG. 4. A three input counter 20 receives control inputs from the burst base addresses AO–A2, burst length control DDR/SDR and Linear Burst or Interleave Burst control LBO. These inputs determine the exact sequence of the eight (or four) bits of the burst. Transitions of the data-latch clocks R_DOCLK and F_DOCLK connect to an OR gate 21 that clocks the counter 20 with the next value of the sequence. The output of the counter is connected to a 3-to-8 Decoder 22 that provides the eight bits for controlling the 8-to-1 multiplexers 13 and 14. To prevent race conditions between rising-edge data RT and R_DOCLK at the data-latch pair 16, control inputs to multiplexer 12 (which selects rising-edge data) is captured at 24 by the falling-edge clock F_DOCLK. Likewise, to prevent race conditions between falling-edge data DON-EXT2 and F_DOCLK at the data-latch pair 16, control inputs to multiplexer 13 (which selects rising-edge data) is captured at 22 by the rising-edge clock R_DOCLK.

Figure 5:
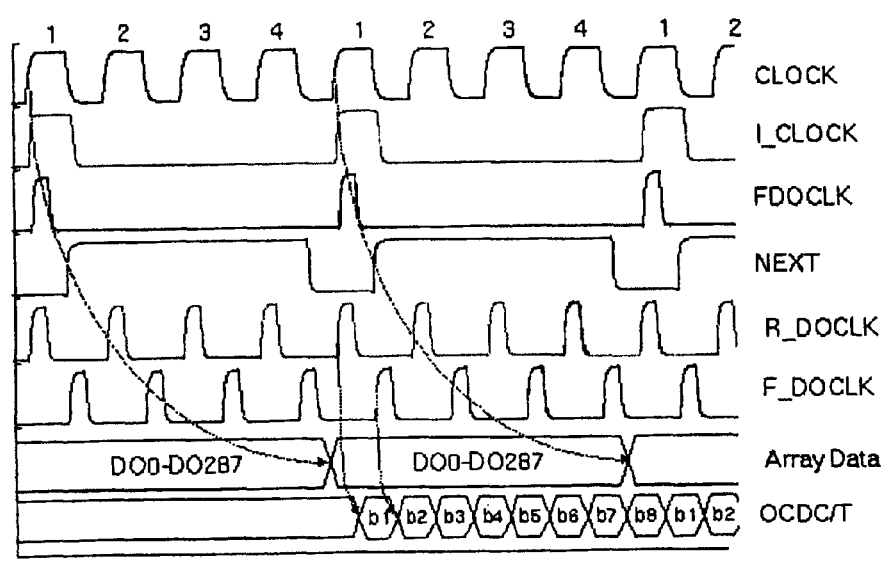
FIG. 5 shows a waveform diagram that illustrates the operation of the burst sequencing circuit.

FIG. 5 shows a waveform diagram that illustrates the functionality of the memory system. The memory performs one read (or write) operation every four external clock cycles. This is shown by the external clock signal CLOCK and the internal clock signal I_ICLOCK. Array data DO0–DO287 is accessed from a memory location on every first of four CLOCK cycles. Signal FDOCLK captures DO data at the burst sequence latches at the start of a cycle, and signal NEXT transitions low to allow the first bit of the burst sequence to pass through the 9-to-1 multiplexer. After the first bit of the burst (b1) is clocked out by R_DOCLK, signal NEXT returns high to select the next bits of the burst sequence. Rising-edge clock R_DOCLK updates OCDC/T on rising edges CLOCK, while falling-edge clock F_DOCLK updates OCDC/T on falling edges of CLOCK.

While the invention has been shown and particularly described with reference to a preferred embodiment, it will be understood by those skilled in the art that various changes in form and detail may be made without departing from the spirit and scope of the invention.

What is claimed is:

1. A memory device with a plurality of inputs/outputs comprising:
   a clock having rising and falling I/O edges;
   a storage array that includes a plurality of subarrays which contain data cells for storing and retrieving digital data, wherein each subarray contains a matrix of wordlines and bitlines, such that when a wordline is selected in the subarray the subarray provides n-bits of data to be output in a m-bit burst for every I/O of the memory device;
   the n-bits of data of each wordline entry of the subarray has a fixed three-bit burst-address allocation for each of the I/O bits; and
   a burst sequencing circuit for output in a burst of m-bits for every I/O of the memory device in a preselected order in accordance to the x-bit base-address where x is less than m which is less then n and linear or interleave burst sequence controls.

2. The memory device according to claim 1 wherein the burst sequence circuit where the first bit of the m-bit burst sequence where m is eight is output through a 9-to-1 multiplexer with eight of the nine inputs used by the first bit of the burst sequence to be output; the eight of the nine inputs are preselected by the burst base address; and subsequent seven bits of the eight-bit burst sequence are output on subsequent rising and falling edges of the clock.

3. The memory device of claim 2 wherein the burst sequence circuit where the eight burst bits from the array are stored in burst sequence latches to be used for the subsequent seven bits of the burst.

4. The memory device according to claim 3 which includes a rising-edge-data 8-to-1 multiplexer which selects subsequent burst bits from data stored in the burst sequence latches and to be output on subsequent rising clock edges.

5. The memory device according to claim 4 which includes a 9-to-1 multiplexer where the ninth input of the multiplexer selects subsequent burst bits from the rising-edge-data multiplexer to be output in subsequent rising edges of the clock.

6. The memory device according to claim 5 which includes a falling-edge-data 8-to-1 multiplexer used to select subsequent burst bits from data stored in the burst sequence latches and to be output on subsequent falling edges of the clock.

7. The memory device according to claim 6 which includes a burst data to an output driver.

8. The memory device according to claim 7 wherein the rising-edge data and falling-edge data are clocked with two non-overlapping rising and falling edge clock strobes.

9. The memory device according to claim 7 wherein the access time of the true and complement data from the rising edge clock strobe is equal to the access time of the true and complement data from the falling edge clock strobe.

10. The memory device according to claim 7 wherein the rising-edge data is input from the 9-to 1 multiplexer an falling-edge data is inupt from the falling-edge-data 8-to-1 multiplexer.

11. The memory device of claim 5 includes a burst sequence controller which receives burst base addresses, burst order and burst length controls to provide inputs to falling-edge-data and rising-edge-data multiplexers.

12. The memory device of claim 11 wherein the controller is incremented or decremented whenever rising-edge or falling-edge data clocks transition.

13. The memory device of claim 2 which includes a rising-edge-data 8-to-1 multiplexer whose control inputs are updated from a burst sequence controller by a falling-edge-data clock.

14. The memory device of claim 13 which includes a falling-edge-data 8-to-1 multiplexer whose control inputs are updated from a burst sequence controller by the rising-edge of the clock.

* * * * *